US007745103B2

(12) United States Patent
Yoneshima et al.

(10) Patent No.: US 7,745,103 B2
(45) Date of Patent: Jun. 29, 2010

(54) PRODUCT WITH CONCAVE-CONVEX PATTERN ON ITS SURFACE AND METHOD OF FORMING THE CONCAVE-CONVEX PATTERN

(75) Inventors: Sadayuki Yoneshima, Hirakata (JP); Mitsushi Sogabe, Katano (JP); Tsuyoshi Tamaki, Kawasaki (JP)

(73) Assignee: Tanazawa Hakkosha Co., Ltd., Osaka (JP)

( * ) Notice: Subject to any disclaimer, the term of this patent is extended or adjusted under 35 U.S.C. 154(b) by 216 days.

(21) Appl. No.: 11/989,337

(22) PCT Filed: Nov. 21, 2006

(86) PCT No.: PCT/JP2006/323158

§ 371 (c)(1), (2), (4) Date: Jan. 24, 2008

(87) PCT Pub. No.: WO2007/063739

PCT Pub. Date: Jun. 7, 2007

(65) Prior Publication Data

US 2009/0291265 A1 Nov. 26, 2009

(30) Foreign Application Priority Data

Nov. 30, 2005 (JP) ............................ 2005-344828

(51) Int. Cl.
*G03F 1/00* (2006.01)
*H05B 6/00* (2006.01)

(52) U.S. Cl. ....................... 430/322; 430/292; 430/325; 430/328; 264/482

(58) Field of Classification Search ................ 428/156, 428/172; 430/300, 309, 328, 329, 394, 292, 430/322, 325; 264/482; 156/272.8
See application file for complete search history.

(56) References Cited

U.S. PATENT DOCUMENTS 5,149,613 A * 9/1992 Stahlhofen et al. .......... 430/296
5,429,908 A * 7/1995 Hokuf et al. ................ 430/269
6,150,007 A * 11/2000 Oshima et al. .............. 428/161

FOREIGN PATENT DOCUMENTS

| | | |
|---|---|---|
| JP | SHO.55-63299 | 5/1980 |
| JP | HEI.1-209200 | 8/1989 |
| JP | HEI.1-233077 | 9/1989 |
| JP | HEI.1-299100 | 12/1989 |
| JP | 05-064992 | 3/1993 |
| JP | 2001-150891 | 6/2001 |
| JP | 2001-322398 | 11/2001 |
| JP | 2002-248423 | 9/2002 |
| JP | 2002-248899 | 9/2002 |
| JP | 2004-314429 | 11/2004 |

* cited by examiner

*Primary Examiner*—Donald Loney
(74) *Attorney, Agent, or Firm*—Eckert Seamans Cherin & Mellott, LLC; Kirk D. Houser, Esq.

(57) ABSTRACT

A method of manufacturing an decoration film includes the steps of forming a semi-finished decoration film formed with a concave-convex pattern on a surface in a method of manufacturing a printing plate including exposure, cleaning, and drying from a photosensitive resin film; and irradiating laser on the concave-convex pattern of the semi-finished decoration film and removing an unnecessary portion to smooth concave-convex parts and/or provide difference in height of a convex part and depth of a concave part of the concave-convex pattern.

7 Claims, 4 Drawing Sheets

PRODUCT WITH CONCAVE-CONVEX PATTERN ON ITS SURFACE AND METHOD OF FORMING THE CONCAVE-CONVEX PATTERN

BACKGROUND OF THE INVENTION

1. Field of the Invention

The present invention relates to a product with a concave-convex pattern on its surface, a method of forming the concave-convex pattern, and a method of manufacturing a decoration sheet used for forming the concave-convex pattern.

2. Description of the Related Art

An interior part such as a dashboard of an automobile is formed by synthetic resin in terms of light weight and mass production. In order to obtain expensive appearance, stateliness and warmness, a fine concave-convex pattern such as a satin finished surface and grain is formed on a surface thereof. The resin product can be molded by forming a concave-convex pattern of the product on the surface of a die by etching and the like, and a pattern in which the concave part and the convex part are reversed.

However, the die is difficult to be manufactured in terms of cost and time at a trial stage of the automobile. Thus, the concave-convex pattern is formed on the surface of a trial product by attaching a sheet formed with a concave-convex pattern at the trial stage of the automobile. If the sheet is thick, the relevant surface tends to differ from the surface of a mass produced product in terms of quality and image. Furthermore, the cost increases if the concave-convex pattern is complex when the sheet is manufactured from the die.

The applicant has previously proposed a thin decoration film formed with a concave-convex pattern on a surface thereof, as shown in FIG. 6 (see Japanese Examined Patent Publication No. 2001-150891). In the disclosure, the concave-convex pattern is formed on a photosensitive resin film in a printing method including exposure, washing and drying, and coating is performed from above. A final product to be mass produced can be imaged by looking at a trial product with the decoration film attached on the surface thereof, and thereby a design can be determined.

However, the conventional method has the following problems.

The concave-convex pattern surface tends to be rough on the decoration film shown in FIG. 6, since a concave part (24) between adjacent convex parts (22) (22) is drastically depressed from the upper end of the convex part (22). A feeling that the image of the pattern is slightly different from a desired fine pattern of the satin finished surface, grain and the like may arise since the height of the convex part (22) and the depth of the concave part (24) are also even.

Furthermore, when mass producing the dashboard of the automobile by means of a die, the concave-convex pattern on the surface of the dashboard cannot be formed with the convex parts of even height and the concave parts of even depth on the entire surface of the die due to necessity of taking the three dimensional product out from the die. Specifically, assume a dashboard, or a final product (1) having a bent part as shown in FIG. 7. The die for molding the dashboard is released upward and downward.

In this case, if the height of the convex part (22) positioned at the flat portion A and the convex part (22) positioned at the lower end of the inclined portion B are the same, die release becomes difficult as the convex part (22) positioned at the inclined portion B becomes an obstruction. Therefore, the convex part (22) positioned at the lower end of the inclined portion B is formed lower than the convex part (22) positioned at the flat portion A. Thus, a stringent quality is demanded also for the trial product so that the heights of the convex parts (22) are changed depending on the location so as to be the same as the concave-convex pattern on the surface of the mass produced product.

SUMMARY OF THE INVENTION

The present invention aims to achieve a technique of applying smoothness to a concave-convex pattern of a decoration film, and providing difference to a height of a convex part and a depth of a concave part at inexpensive cost.

A method of manufacturing a decoration film according to the present invention includes the steps of forming a semi-finished decoration film (20) formed with a concave-convex pattern on a surface in a method of manufacturing a printing plate including exposure, cleaning, and drying from a photosensitive resin film (21); and irradiating laser on the concave-convex pattern of the semi-finished decoration film (20) and removing an unnecessary portion to smooth the concave-convex parts and/or provide difference in height of a convex part (22) and depth of a concave part (24) of the concave-convex pattern, thereby forming a desired concave-convex surface.

A product having the convex-concave pattern according to the present invention is obtained by attaching a decoration film (2) manufactured in the above method to a surface of the product (1).

In the method of manufacturing the decoration film according to the present invention using both technique of printing the plate and laser irradiation, the concave-convex surface is finished to the desired shape by irradiating laser to the concave-convex pattern surface of the semi-finished decoration film (20). Thus, a complex concave-convex surface having difference in height in multi stages becomes possible, and the height of the convex part and the depth of the concave part can be gradually changed, which were not possible only with the manufacturing method of the printing plate, by irradiating the laser with an output of the laser changed in steps. "Gradually change" herein does not only mean changing the height/depth of a constant amount in steps, but also means changing the height/depth of an indefinite amount bit by bit. Formation of a complex concave-convex pattern such as a composite pattern thereof is now possible.

Time for laser fabrication is greatly reduced and thereby the production cost is reduced compared to forming the concave-convex pattern on the film only by laser irradiation.

(1) product (2) decoration film (3) extremely thin resin film (4) negative film
(21) photosensitive resin film

DETAILED DESCRIPTION OF THE PREFERRED EMBODIMENTS

First Embodiment

One embodiment of the present invention will now be described with reference to drawings.

Figure 1:
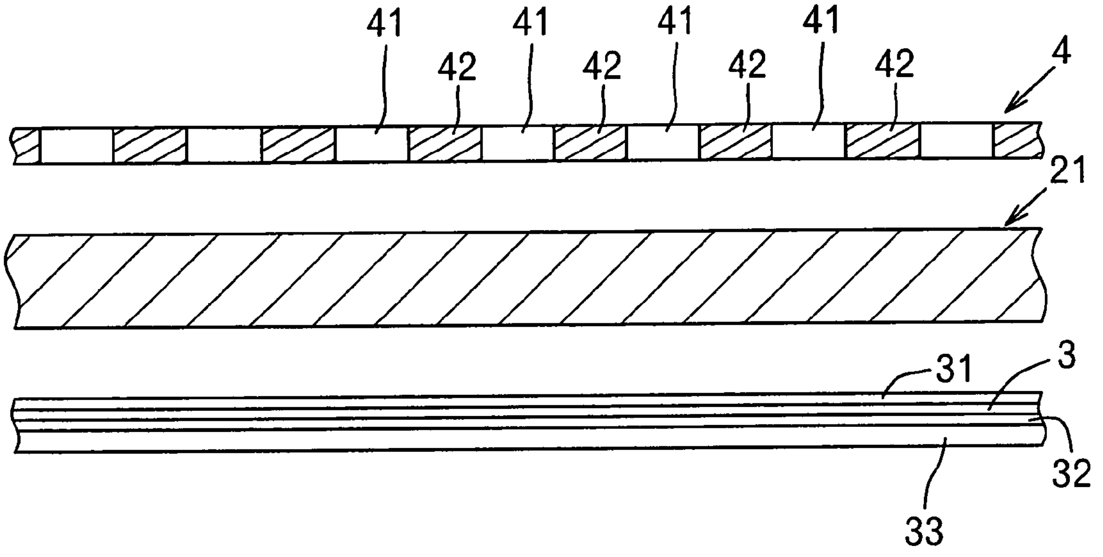
FIG. 1 shows cross sectional views of a photosensitive resin film, a negative film, and a backing resin film.
Figure 3:
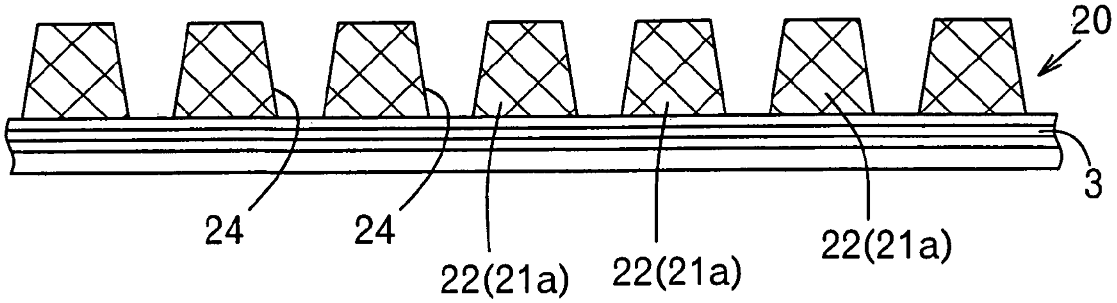
FIG. 3 is a cross sectional view of a semi-finished decoration film.
Figure 4:
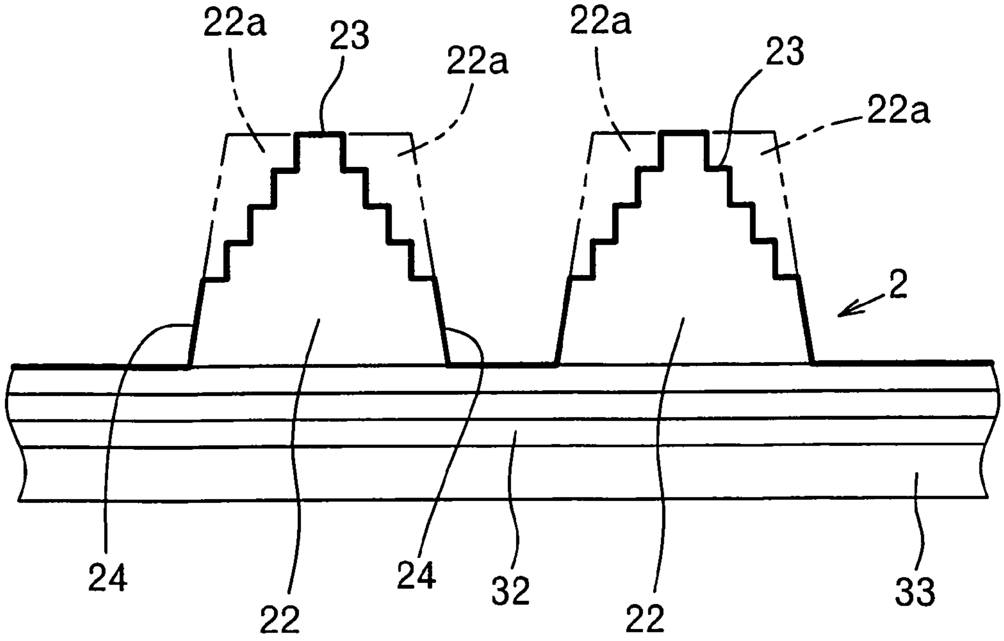
FIG. 4 is a cross sectional view of a finished decoration film.
Figure 5:
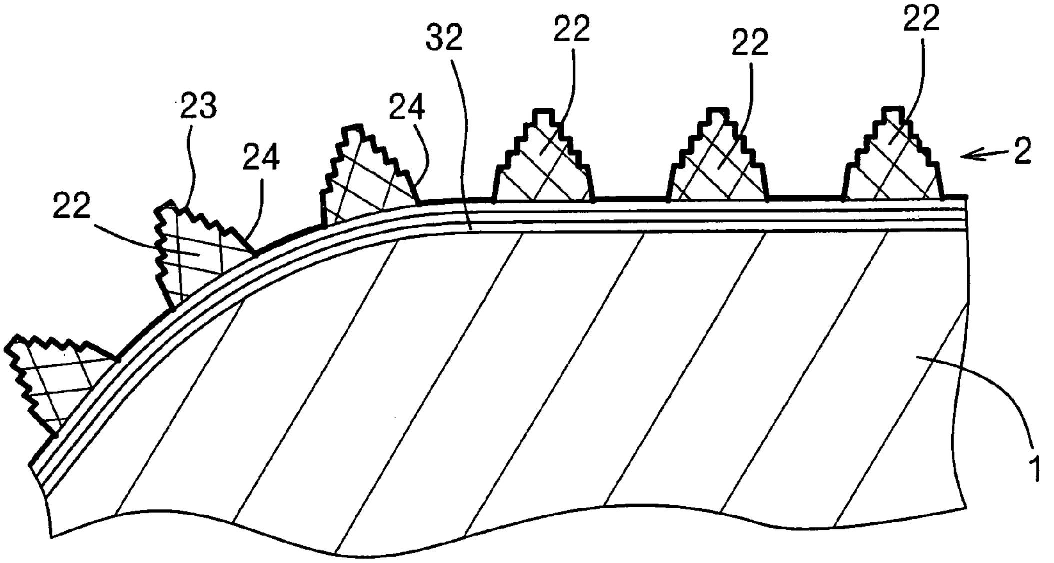
FIG. 5 is a cross sectional view of a state where the decoration film is adhered to the product.
Figure 6:
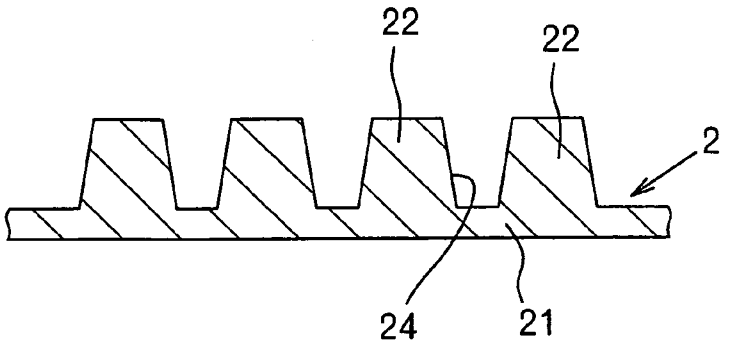
FIG. 6 is a cross sectional view of a decoration film formed in a conventional technique.
Figure 7:
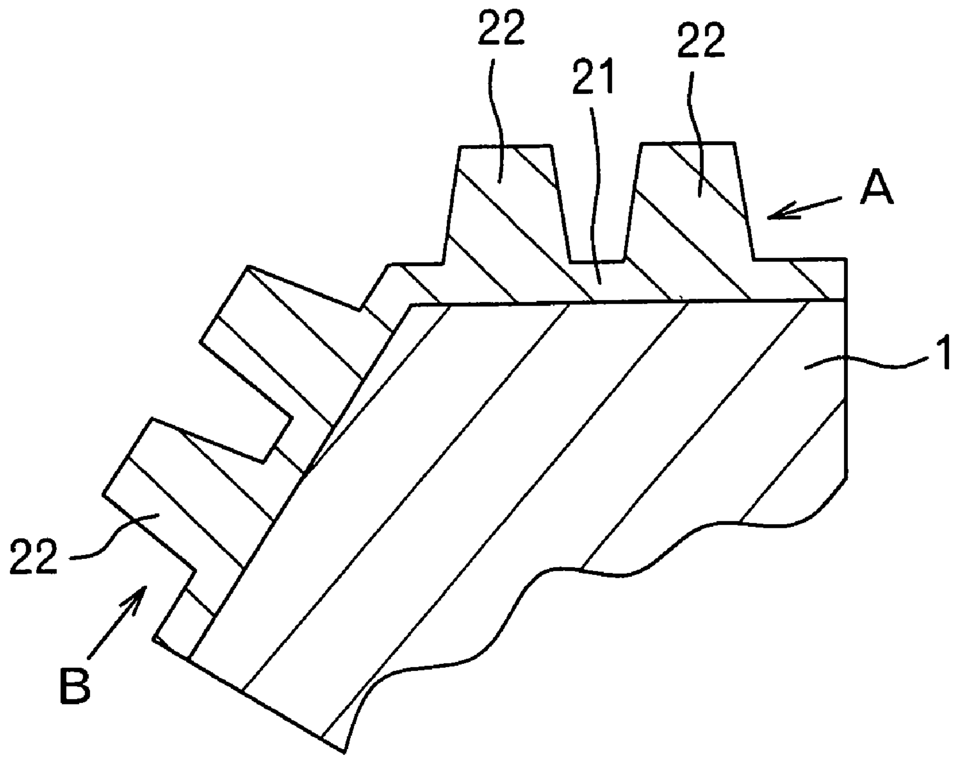
FIG. 7 is a cross sectional view of a product in which heights of convex parts are even.

In the present embodiment, a semi-finished decoration film (20) with a concave-convex pattern formed with a convex pattern on a surface as shown in FIG. 3 is formed from a photosensitive resin film (21) shown in FIG. 1. Subsequently, laser is irradiated on the concave-convex pattern of the semi-finished decoration film and unnecessary portions (22*a*) are removed to finish the surface to a desired concave-convex surface, as shown in FIG. 4. An ink layer (23) by printing is then formed on the concave-convex surface to complete a decoration film (2). As shown in FIG. 5, the decoration film (2) is adhered to a surface of a trial product (1) with an adhesive layer (32) inbetween. The convex pattern is thereby formed on the surface of the product (1). Specific description is given below.

(I) Manufacturing of Decoration Film Using Both Technique of Printing Plate and Laser Irradiation Step 1

As shown in FIG. 1, an extremely thin resin film (3) is attached to a back of the photosensitive resin film (21) in advance. Thickness of the photosensitive resin film (21) is desirably 100 to 300 μm in terms of easiness in attachment to the product (1), and extreme closeness in image with a mass produced product using a die. In the embodiment, thickness of the decoration film (2) is 150 μm.

The extremely thin backing resin film (3) is a double faced adhesive film having adhesive layers (31) (32) across the entire surface of both surfaces, where a release paper (33) covers the adhesive layer (32) on an exterior side. Thickness of the extremely thin resin film (3) itself is 15 to 30 μm.

Step 2

Figure 2:
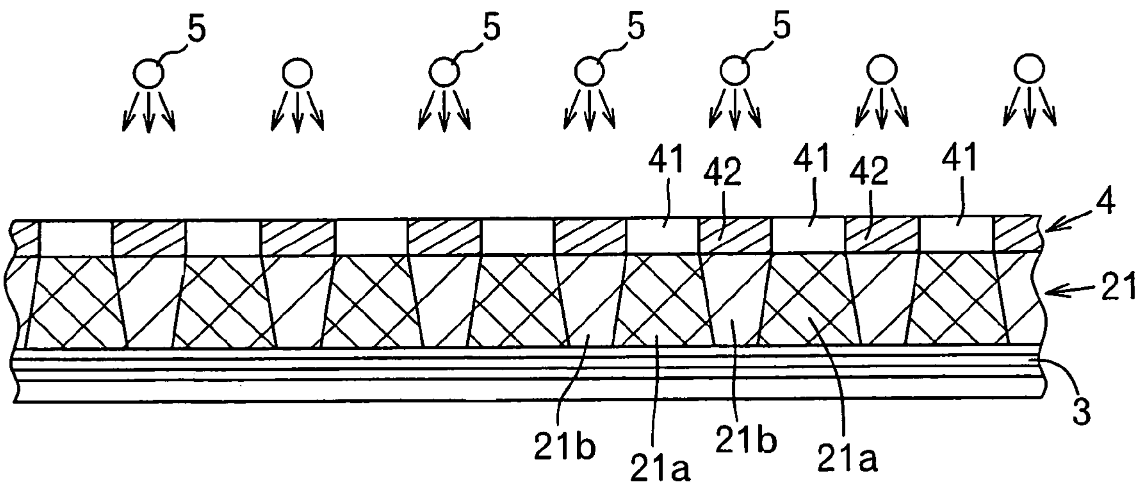
FIG. 2 is an explanatory view for exposing the photosensitive resin film.

As shown in FIG. 2, the photosensitive resin film (21) is covered with a negative film (4) and exposed to light from light sources (5). The negative film (4) has portions corresponding to the convex part (22) of the semi-finished decoration film (20) as a light translucent transmissive portion (42), and other portions as light shielding portions (41). The exposed portions are cured.

Step 3

The negative film (4) is removed, and non-exposed portion (21*b*) is cleaned with water and dried except an exposed portion (21*a*). The semi-finished decoration film (20) with the concave-convex pattern is thereby obtained, as shown in FIG. 3.

Formation of the concave-convex pattern in which the thickness of the photosensitive resin film between the adjacent convex parts (22) (22) is 0 becomes possible since the extremely thin resin film (3) is attached to the back of the photosensitive resin film (21) in advance. That is, an entire thickness of the photosensitive resin film (21) may be the height of the convex part (22).

Step 4

As shown in FIG. 4, the surface with the concave-convex pattern of the semi-finished decoration film (20) is subject to laser irradiation and unnecessary portions (22*a*) are removed to smooth concave-convex parts. Alternatively, a desired concave-convex surface is formed by providing difference to the height of the convex parts (22) or the depth of the concave parts (24) of the concave-convex pattern.

For example, in order to change the concave-convex pattern of the semi-finished decoration sheet (20) that appears rough to appear smooth, side surfaces of the convex part (22) of the concave-convex pattern are formed into step forms, as shown in FIG. 4. This is performed by removing the unnecessary portions (22*a*) while changing an output of the laser in steps.

Since an extremely thin film (3) is attached to the back of the semi-finished decoration film (20), the relevant film (3) acts as the base, and stably holds the semi-finished decoration film (20). Thus, an effect of stabilizing an incident angle of the laser is obtained.

In particular, the effect of the backing resin film (3) of the semi-finished decoration film (20) as the base is further enhanced in the embodiment, since the relevant film is a double sided adhesive film covered with the release paper (33).

Step 5

Printing is performed on the decoration film (2) in which the concave-convex pattern is fabricated to the desired concave-convex surface by laser irradiation, and an ink layer (23) is formed on the concave-convex surface. Such a process is performed since the decoration film (2) must be a transparent body due to necessity for light exposure, and a rough surface of the laser irradiated surface is to be hidden.

When the concave-convex surface has a woody grain texture, printing is performed in a color close to the actual woody grain texture so that the color blends with the convex pattern, and a very realistic woody grain texture can be obtained.

A printing method that can be used includes ink jet printing, screen printing, relief printing, off set printing and the like.

Surface hardness of the pattern may be increased by further performing exposure to the photosensitive resin film (21), as necessary, between step 3 and step 4.

Steps 2 and 3 are the same as the step of manufacturing the printing plate with the photosensitive resin film (21). Therefore, exposure time and the like can be suitably set according to the type, thickness and the like of the photosensitive resin film (21).

The order of the backing the resin film (3) to the photosensitive resin film (21) and exposure may be reversed. In other words, the extremely thin resin film (3) may be attached to the back of the photosensitive resin film after covering the negative film (4) on the photosensitive resin film (21) and performing the exposure, and thereafter proceeding to step 3.

Printing on the concave-convex pattern surface of the decoration film (2) may be changed to coating.

(II) Pre-Process of Product (1)

Dirt and oil content on the surface of the product (1) are removed with solvent, alcohol and the like as a pre-process on the trial product (1) made of resin, thereby enhancing adhesiveness between the product (1) and the adhesive layer (32) of the decoration film (2).

(III) Manufacturing of Product (1) Having Concave-Convex Pattern

The release paper (33) on the decoration film (2) is stripped, and the decoration film (2) is attached to the trial product (1) performed with the pre-process of (II). The product having the concave-convex pattern on the surface is thereby obtained.

In the above embodiment, printing or coating may be performed on the decoration film (2) after attaching the decoration film to the product (1). Printing to be performed in a case of the product (1) having the concave-convex parts formed thereon may be hydraulic transfer printing.

In the method of manufacturing the decoration film (2) described above, the semi-finished decoration film (2) formed with the concave-convex pattern on the surface in the technique of printing the plate is formed on the photosensitive film (21), and laser is irradiated on the concave-convex pattern surface of the semi-finished decoration film (2) to finish the concave-convex surface to the desired shape. Thus, formation of a complex concave-convex surface having difference in height in multi steps, which was impossible only with the technique of printing the plate, is now possible by changing the laser output in steps.

Strength of the decoration film (2) is enhanced by attaching the extremely thin resin film (3) on the back. The decoration film (2) is less likely to be ripped even when pulled, and even stretches in some small measures since the concave-convex pattern, that is, the concave part (24) is formed between the convex parts (22) (22). The film can be more easily attached to the three dimensional shape of the product (1).

The backing film (3) does not become an obstacle even if the decoration film (2) is adhered along the concave-convex parts of the product (1) since the backing film (3) is extremely thin.

The trouble of applying adhesive to the decoration film (2) or the product (1) is saved since the extremely thin backing resin film (3) is the double sided adhesive film, and thus workability of adhesion is enhanced. Furthermore, adhesion can be carried out nicely without producing an adhesion patch due to the adhesive since the thickness of the adhesive layer (32) for adhering to the surface of the product is uniform.

It is sometimes difficult to attach the decoration film (2) to the surface of the product (1) without producing a wrinkle depending on the three dimensional concave-convex parts of the product (1). In this case, an extra portion of the decoration film (2) is cut and attached to the product (1) so that no wrinkle is produced.

In performing the present invention, the product (1) to be attached with the decoration film (2) is not limited to those made of synthetic resin. The material can be of any material as long as attachment of the decoration film (2) is possible, such as wood, metal, etc. Furthermore, the product (1) is not limited to the trial product.

Second Embodiment

A desired concave-convex pattern is formed on one surface of a synthetic resin film of uniform thickness only by laser irradiation. The synthetic resin film can be of any type as long as it is soft and accepts concave-convex fabrication by laser irradiation.

An extremely thin resin film is desirably attached to a back of the film in advance. The extremely thin resin film is desirably a double sided adhesive film. This is due to reasons proved in the first embodiment.

What is claimed is:

1. A method of manufacturing a decoration film comprising the steps of:

forming a semi-finished decoration film formed with a concave-convex pattern on a surface in a technique of manufacturing a plate including exposure, cleaning, and drying from a photosensitive resin film to a back of which a stretchable resin film is attached, a thickness of the photosensitive resin film between adjacent convex parts of the concave-convex pattern is 0; and irradiating laser on the concave-convex pattern of the semi-finished decoration film and removing an unnecessary portion to smooth concave-convex parts and/or provide difference in height of a convex part and depth of a concave part of the concave-convex pattern.

2. The method of manufacturing the decoration film according to claim 1, wherein the stretchable resin film is attached to the back of the photosensitive resin film in advance before exposing the photosensitive resin film.

3. The method of manufacturing the decoration film according to claim 1, wherein the stretchable resin film is a double sided adhesive film having adhesive layers on both surfaces.

4. The method of manufacturing the decoration film according to claim 1, wherein the concave-convex pattern on the semi-finished decoration film is formed by laser irradiation to a plurality of convex parts.

5. The method of manufacturing the decoration film according to claim 1, wherein laser is irradiated with an output of the laser irradiation controlled in a plurality of steps.

6. A method of forming a convex pattern on a surface of a product by attaching the decoration film produced in the method according to claim 1 to the surface of the product.

7. The method of manufacturing the decoration film according to claim 1, wherein a thickness of the stretchable resin film is 15 to 30 μm.

* * * * *